United States Patent [19]

Ide et al.

[11] Patent Number: 5,013,692
[45] Date of Patent: May 7, 1991

[54] PROCESS FOR PREPARING A SILICON NITRIDE INSULATING FILM FOR SEMICONDUCTOR MEMORY DEVICE

[75] Inventors: Shigeaki Ide, Yamatokoriyama; Ichiroh Oki, Nara, both of Japan

[73] Assignee: Sharp Kabushiki Kaisha, Osaka, Japan

[21] Appl. No.: 446,115

[22] Filed: Dec. 5, 1989

[30] Foreign Application Priority Data

Dec. 8, 1988 [JP] Japan .................. 63-310510
Apr. 18, 1989 [JP] Japan .................. 63-99789

[51] Int. Cl.$^5$ .................. H01L 21/283; H01L 21/31; H01L 21/311
[52] U.S. Cl. .................. 437/241; 437/242; 437/919; 142/DIG. 14; 142/DIG. 114
[58] Field of Search .................. 437/241, 242, 919; 148/DIG. 14, DIG. 114; 357/23.6

[56] References Cited

U.S. PATENT DOCUMENTS

| | | | |
|---|---|---|---|
| 3,788,894 | 1/1974 | Scherber | 437/241 |
| 4,010,290 | 3/1977 | Boland | 437/241 |
| 4,089,992 | 5/1978 | Doo et al. | 437/241 |
| 4,240,092 | 12/1980 | Kuo . | |
| 4,438,157 | 3/1984 | Romano-Moran | 437/241 |
| 4,532,022 | 7/1985 | Takasaki et al. | 437/241 |
| 4,636,400 | 1/1987 | Nishioka et al. | 437/241 |
| 4,692,344 | 9/1987 | Kaganowicz et al. | 437/241 |

FOREIGN PATENT DOCUMENTS

| | | | |
|---|---|---|---|
| 0040455 | 12/1970 | Japan | 437/241 |
| 0031034 | 9/1973 | Japan | 437/241 |
| 0133373 | 11/1978 | Japan | 437/241 |
| 0162967 | 12/1979 | Japan | 437/242 |
| 0022863 | 2/1980 | Japan | 437/241 |
| 0134938 | 10/1980 | Japan | 437/241 |
| 0028376 | 7/1981 | Japan | 437/241 |
| 0037838 | 3/1982 | Japan | 437/241 |
| 0036742 | 8/1982 | Japan | 437/241 |
| 0204134 | 12/1982 | Japan . | |
| 0014560 | 1/1983 | Japan | 437/241 |
| 0051542 | 3/1983 | Japan | 437/241 |
| 0018677 | 1/1984 | Japan | 437/241 |
| 0090942 | 5/1984 | Japan . | |
| 0119841 | 7/1984 | Japan . | |
| 8909494 | 10/1989 | PCT Int'l Appl. . | |
| 0947271 | 1/1964 | United Kingdom | 437/241 |

OTHER PUBLICATIONS

Wolf et al., *Silicon Processing for the VLSI Era*, vol. 1-*Process Technology*, Lattice Press, 1986, pp. 191-194.
J. Yugami et al., "Inter-Poly $SiO_2/Si_3N_4$ Capacitor Films 5 nm Thick for Deep Submicron LSIs", Extended Abstracts of the 20th (1988 International) Conference on Solid State Devices and Materials, Tokyo, 1988, pp. 173-176.
J. Mitsuhashi et al., "TDDB Measurements of $SiO_2$ Gate and $SiO_2/Si_3N_4/SiO_2$ Gate Structure", Extended Abstracts of the 17th Conference on Solid State Devices and Materials, Tokyo, 1985, pp. 267-270.

*Primary Examiner*—Olik Chaudhuri
*Assistant Examiner*—M. Wilczewski
*Attorney, Agent, or Firm*—Sandler, Greenblum & Bernstein

[57] ABSTRACT

A process for preparing an insulating film for semiconductor memory device which comprises forming a silicon nitride film over a substrate by a CVD technique, oxidizing the surface of the silicon nitride film to form a silicon oxide layer over the film, and removing the silicon oxide layer by etching to form an improved silicon nitride film, which is suitably used for the formation of a capacitor of highly integrated memory device.

10 Claims, 2 Drawing Sheets

PROCESS FOR PREPARING A SILICON NITRIDE INSULATING FILM FOR SEMICONDUCTOR MEMORY DEVICE

BACKGROUND OF THE INVENTION

1. Field of the Invention

The present invention relates to a process for preparing an insulating film for semiconductor memory devices. The insulating film according to this invention is suitably used for a capacitor of a highly integrated memory device such as a DRAM.

2. Description of the Prior Art

As semiconductor memory devices are being more highly integrated, thinner insulating films for such devices are required. It has been a conventional practice to use a thermally oxidized $SiO_2$ film as the insulating film. However, when the thickness of the $SiO_2$ film is below 100 Å, which is required for high integration, the film is heterogeneous in thickness thereby lowering the reliability thereof.

Therefore, a laminated structure is now given to an insulating film having a thickness below 100 Å so that the reliability can be improved. Specifically, as will be described below, a silicon nitride film prepared by CVD is used as a part of the laminated structure.

The silicon nitride film, which has a good homogeneity in thickness, has many pinholes therein and allows the Poule-Frenkel type conduction, with the result that the film alone is inferior to a $SiO_2$ film in dielectric strength. Thus, there has been proposed to constitute an insulating film for memory device with the laminated structure of (top) silicon oxide/silicon nitride (bottom) which is obtained by thermally oxidizing to 10-30 Å in depth the top of the silicon nitride film, or the structure of (top) silicon oxide/silicon nitride/silicon oxide (bottom) which is provided with a thermally oxidized $SiO_2$ film under the former structure U.S. Pat. No. 4,240,092; "Inter-Poly $SiO_2/Si_3N_4$ Capacitor Films 5nm Thick for Deep Submicron LSIs" Extended Abstracts of the 20th (1988 International) Conference on Solid State Devices and Materials, Tokyo, 1988, pp. 173-176; "TDDB Measurement of $SiO_2$ Gate and $SiO_2/Si_3N_4/SiO_2$ Gate Structure" Extended Abstracts of the 17th Conference on Solid State Devices and Materials, Tokyo, 1985, pp. 267-270]. The silicon oxide/silicon nitride/silicon oxide laminated structure is actually used for 1M-bit DRAMs or 4M-bit DRAMs.

Laminated structure of an insulating film for memory devices improves the reliability thereof, while decreasing the capacitance thereof, because the structure provides a serial connection of capacitor elements. Thus, the silicon oxide/silicon nitride laminated structure resulting from the oxidation of the top of the silicon nitride film improves the reliability of dielectric strength of the insulating film, but causes an unavoidable decrease in the capacitance. Such a decrease in the capacitance may induce malfunction of the memory devices, thereby lowering the reliability thereof.

SUMMARY OF THE INVENTION

The present invention is accomplished to overcome the above-mentioned problems, and an object of the invention is to provide a thinner insulating film having a greater capacitance for use in semiconductor memory devices.

It has been now found that, if the top of a silicon nitride film is thermally oxidized to form a silicon oxide layer and the layer is subsequently removed by etching, the dielectric strength of the film is remarkably improved without increasing the thickness thereof.

Thus, according to the invention, there is provided a process for preparing an insulating film for semiconductor memory devices which comprises forming a silicon nitride film over a substrate by a CVD (Chemical Vapor Deposition) technique, oxidizing a surface of the silicon nitride film to form a silicon oxide layer over the film, and removing the silicon oxide layer by etching to form an improved silicon nitride film.

DETAILED DESCRIPTION OF THE PREFERRED EMBODIMENTS

Figure 1:
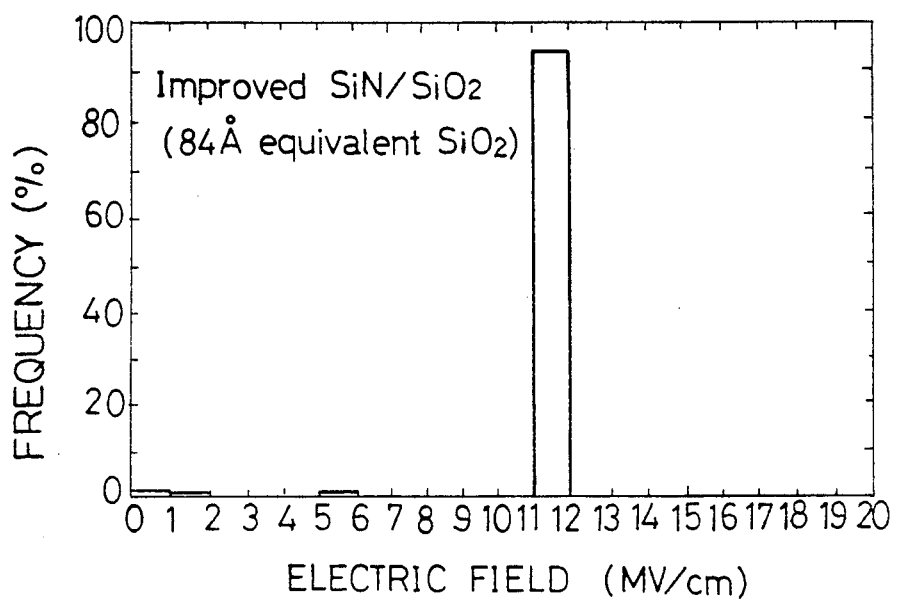
FIG. 1 is a graph showing dielectric strength of an insulating film comprising a silicon nitride film of the invention.

According to the invention, first a silicon nitride film is formed over a substrate for semiconductor memory devices. As used herein, the substrate typically includes a silicon wafer and a silicon wafer laminated with polycrystalline silicon layer, which may have an oxide layer such as a $SiO_2$ or $Ta_2O_5$ layer being formed thereover. It should be understood that when a substrate having a $SiO_2$ or $Ta_2O_5$ layer thereover is used in this invention, a capacitor is constituted of a silicon nitride (hereinafter abbreviated as SiN/$SiO_2$ structure or SiN/$Ta_2O_5$ structure. The oxide layer of the substrate may be intentionally formed to improve the dielectric strength thereof. However, the oxide layer may include one formed inevitably, for example, a thin $SiO_2$ layer formed over and during the preparation of the above polycrystalline silicon layer. In the case where an extra high dielectric strength is required, a substrate having such an oxide layer is suitably used. However, with a view of decreasing the thickness of a capacitor and preventing TDDB (Time Depended Dielectric Breakdown) caused by charge trap at the surface boundary between $SiO_2$ and SiN layer, it is preferable to use a substrate not having the oxide layer. From this view point, when the silicon wafer laminated with a polycrystalline silicon layer is used as the substrate, the thin $SiO_2$ layer on the polycrystalline silicon layer is preferably removed by etching prior to forming a SiN film.

The SiN film is formed over the above-mentioned substrate by a known CVD technique. Typically, it is suitable to employ the CVD technique wherein ammonia or a nitrogen is used as a nitrogen source, and silane or a derivative thereof (for example, $SiH_4$, $SiH_2Cl_2$, $SiCl_4$ or the like) as a silicon source, especially with a low-pressure CVD being preferable. In this case, the substrate temperature is preferably 600° to 800° C. The thickness of the SiN film is adjusted so that the capacitor comprising the SiN film may have a predetermined dielectric strength and capacitance. Generally, the thickness of the SiN film is adjusted to 50 to 60Å as $SiO_2$ equivalent film thickness, which means the corresponding $SiO_2$ film thickness in capacitance.

Oxidation to the surface of the SiN film is carried out by a thermal oxidation, preferably by a typical wet-thermal oxidation. In this wet-thermal oxidation, the surface of the SiN film is heat-treated at 950° to 1100° C. under a steam atmosphere. In this case, an acidic gas such as HCl gas may be contained in the atmosphere. The thickness of the $SiO_2$ layer to be formed is preferably more than about 10Å. The upper limit of the thickness is not specifically determined, however, in view of ease for etching removal, the thickness should not exceed 20Å.

According to the invention, the above-mentioned $SiO_2$ layer is formed, then the $SiO_2$ layer is removed by etching. The etching removal may be performed by either wet-etching or dry-etching (ion beam etching, RIE etc). It is preferable to employ the wet-etching using an etchant having a high selectivity to $SiO_2$.

Such an etchant preferably contains hydrogen fluoride, and examples thereof include hydrofluoric acid itself and an aqueous solution of hydrogen fluoride and ammonium fluoride. When these etchants are used, more preferable are those etchants having an HF concentration of about 0.5 to about 5% by weight.

In the removal treatment using the etchant, the substrate formed with a $SiO_2$/SiN film thereover is generally immersed in the etchant at 20° to 30° C. The treatment is performed until the $SiO_2$ layer has been dissolved and removed. The treatment time can be extended to about 150% overetching time. For example, when the $SiO_2$ layer whose thickness is about 10Å to about 20Å is formed, it is suitable to etch for 40 sec. (just etching time) to 100 sec. (150% overetching time) by hydrofluoric acid.

The improved silicon nitride film of the invention thus obtained is superior to a non-treated silicon nitride film in dielectric strength. Especially, the film of the invention has an excellent dielectric strength similar to that of a silicon nitride film on which the $SiO_2$ layer is remained. Accordingly, using the improved film enables to prepare on a substrate an SiN capacitor being thinner than that of the prior art. As well, removing the $SiO_2$ layer on a SiN film prevents or inhibits decrease in capacitance of the capacitor whereby a semiconductor memory device with high capacitance and reliability can be obtained. Especially, when a capacitor is constituted by only a SiN film of the invention, a thin capacitor to about 30Å in thickness can be formed.

So far, we cannot clarify the reason why a SiN film is improved in dielectric strength when the surface of the SiN film is once oxidized to form an $SiO_2$ layer and the layer is then removed. However, we can infer that the oxidation of the surface of a SiN film does not only convert SiN at the surface area to $SiO_2$ and but also causes the $SiO_2$, to grow into the inner pinholes of the SiN film so that the pinholes are closed, with the result that a SiN film having a high dielectric strength can be obtained even after the $SiO_2$ layer is removed by etching.

EXAMPLES

EXAMPLE 1

Below will be described an example wherein a capacitor having a $SiN/SiO_2$ structure is prepared by the process of the invention.

A silicon wafer of about 10 cm diameter was thermally oxidized at 850° C. under a steam atmosphere containing HCl to form over the surface of the substrate a $SiO_2$ layer of 35Å in thickness. SiN was deposited over the $SiO_2$ layer to form a SiN film of about 85Å in thickness under the following Low Pressure CVD conditions:

source gas : $NH_3/SiH_2Cl_2$
pressure : 0.003 torr
deposition temperature : 770° C.

Next, over the surface of the SiN film was formed another $SiO_2$ layer of about 15Å in thickness by thermal oxidation at 950° under a steam atmosphere. Now obtained was an insulating layer having the $SiO_2/SiN/SiO_2$ structure.

The substrate was then immersed in hydrofluoric acid (0.55% by weight) for one minute to completely remove the $SiO_2$ layer on the surface of the SiN film. The improved SiN film of the invention was thus obtained.

Thereafter, a polysilicon layer was deposited over the film and doped with phosphorus to decrease the resistance thereof. Patterning was performed on the polysilicon layer by dry-etching to form electrodes (4×4 mm square: 86 pieces).

Figure 2:
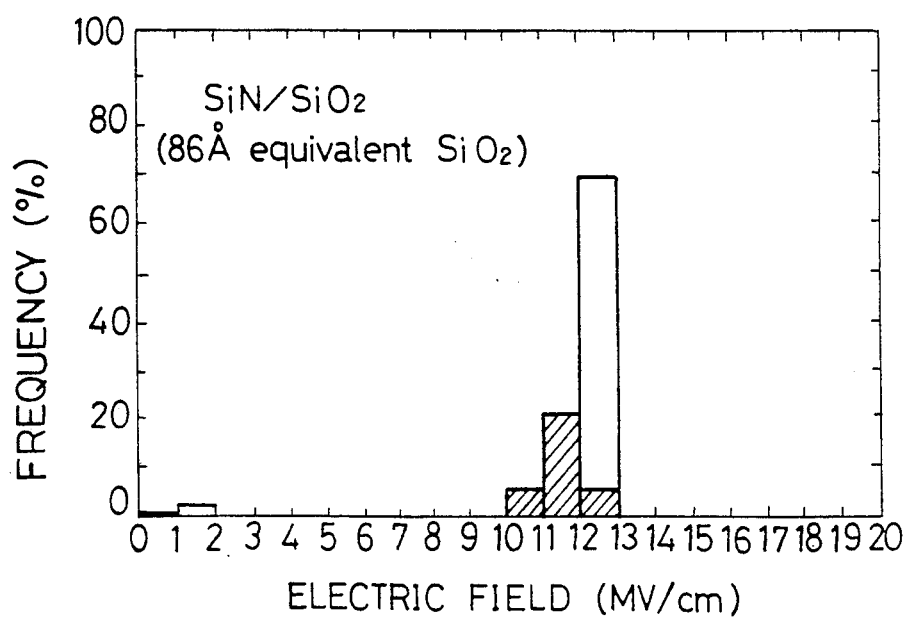
FIGS. 2 and 3 are graphs showing dielectric strength of each insulating film of comparative examples, respectively.
Figure 3:
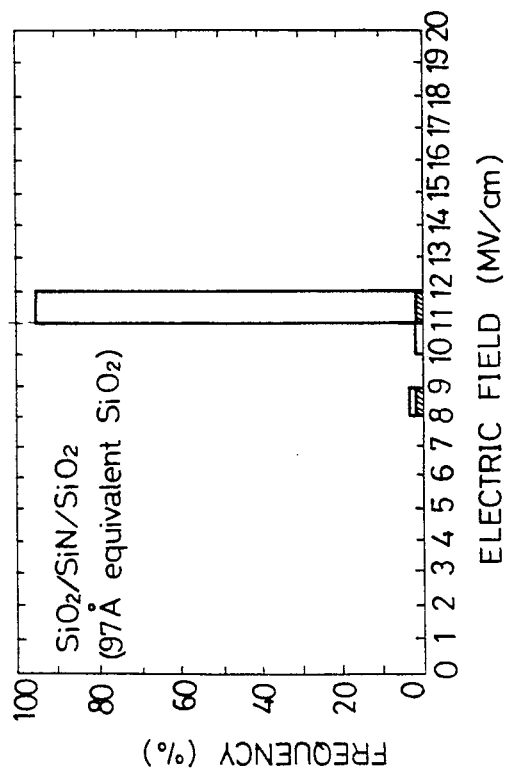

Voltage was applied between the back of the substrate and each of the electrodes to evaluate the dielectric strength property of the $SiN/SiO_2$ film and the $SiO_2$ equivalent film thickness thereof. The result is shown in FIG. 1. In addition, comparative evaluations with the $SiN/SiO_2$ film having a non-treated SiN film and with the $SiO_2/SiN/SiO_2$ film wherein the top $SiO_2$ layer is not removed are shown in FIG. 2 and FIG. 3, respectively. FIGS. 1 to 3 are histograms of dielectric breakdown frequency, the hatching part thereof indicating permanent breakdown at the second measurement.

Permanent breakdown is conspicuous when a SiN film is not oxidized, whereas it is rarely seen when a SiN film has been oxidized and when the surface $SiO_2$ layer has been removed after oxidizing the SiN film. The $SiO_2$ equivalent film thickness of the $SiO_2/SiN/SiO_2$ film is 97Å while that of the $SiN/SiO_2$ film (with the treatment of oxidation, then removal) is 84Å. This means that a thinner insulating film of high reliability for memory devices is formed.

Note that when the measuring current exceeded 1µA, it was judged that dielectric breakdown occurred, and when a tip allowed 1µA or more in the voltage range of below 1 MV/cm, it was defined that permanent breakdown had occurred in the tip.

EXAMPLE 2

Using as a substrate a silicon wafer over which a polysilicon film having a top $SiO_2$ layer of about 8Å in thickness was formed, SiN was deposited over the substrate to form a SiN film of 70 to 90Å in thickness by CVD as described in Example 1.

The surface of the SiN film was then thermally oxidized to about 10 to 20Å in depth. The oxidized layer was removed by the same hydrofluoric acid as used in Example 1 to obtain an improved SiN film. Next, in the same manner as described in Example 1, a polysilicon layer was deposited on the improved SiN film by LPCVD and doped with impurities to decrease resistance, patterning was then performed to obtain top electrodes of a desired shape.

The insulating characteristics of the improved SiN film thus obtained was compared with those of the $SiO_2$/SiN laminated insulating film wherein the $SiO_2$ layer on the SiN film was not removed. As a result, $SiO_2$ equivalent film thickness of the improved SiN film decreased by 15A, while deterioration thereof was rarely seen.

The following table shows the results of the measurements with reference to dielectric strength, capacitance per unit area, and $SiO_2$ equivalent film thickness.

| Item | Improved SiN film | $SiO_2$/SiN film |
|---|---|---|
| average dielectric strength (MV/cm) | 11.0 | 11.6 |
| defeat density (cm$^{-2}$) | ≤1 | ≤1 |
| capacitance per unit area (fF/$\mu m^2$) | 5.85 | 6.34 |
| $SiO_2$ equivalent film thickness (Å) | 38 | 53 |

EXAMPLE 3

A silicon wafer having a polysilicon film with a top $SiO_2$ layer, which was the same wafer as used in Example 2, was subjected to plasma etching using $CF_4/CHF_3$ mixtured gas to remove the top $SiO_2$ layer.

In the same manner as described in Example 2, performed were formation of a SiN film, thermal oxidation of the surface of the SiN film, and removal of the thermally oxidized layer by etching. Subsequently, deposition of polysilicon, doping, and patterning were carried out.

Figure 4:
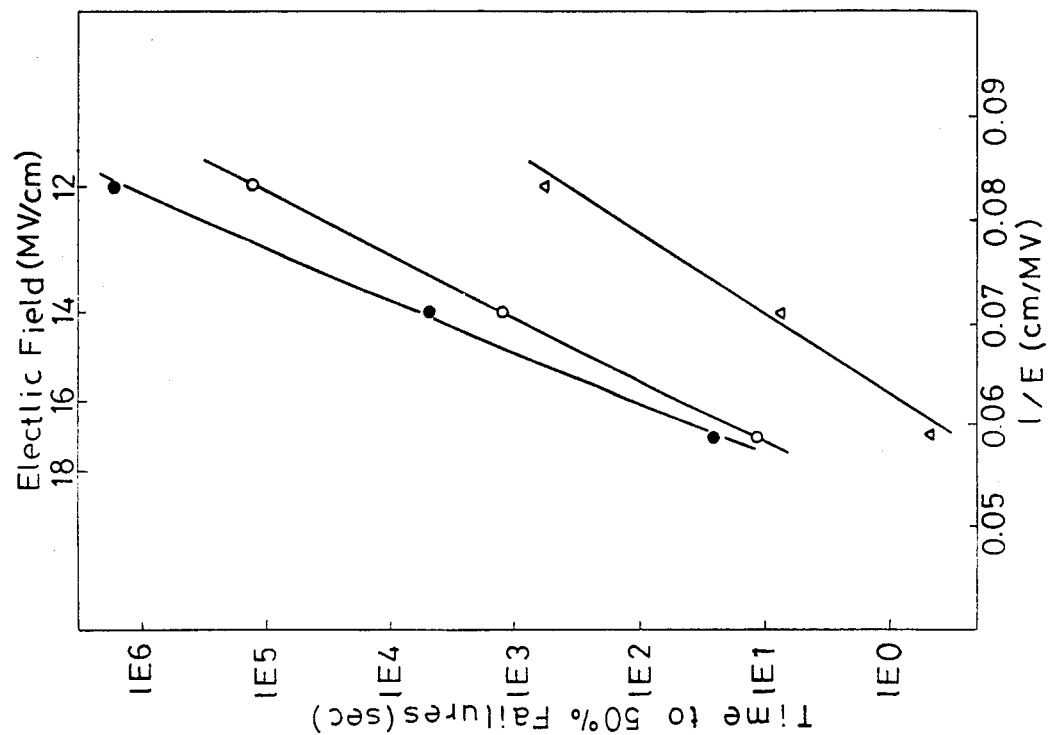
FIG. 4 is a graph showing a frequency of TDDB occurrences of an insulating film comprising a single silicon nitride film of the invention, with that of comparative examples.

With reference to the insulating film comprising the improved SiN film alone thus obtained, TDDB frequency was evaluated under a constant voltage (plot ). The result of the evaluation was compared with that of non-treated SiN film (plot Δ) and that of $SiO_2$/-SiN/$SiO_2$ film (plot ) and shown in FIG. 4. FIG. 4 is a graph showing the relationship between the reciprocal of electric field intensity and the time to 50% failure.

As is clear from FIG. 4, when the SiN film of the invention is formed directly over the polysilicon film whose $SiO_2$ layer was removed, TDDB occurrence is inhibited. Application of a single SiN film of the invention makes it possible to prepare about 30Å-thick capacitor having a high capacitance and reliability.

What is claimed is:

1. A process for preparing an insulating film for a semiconductor memory device which comprises formed a silicon nitride film over a substrate by a CVD technique, oxidizing the surface of the silicon nitride film to form a silicon oxide layer over the silicon nitride film, and removing the silicon oxide layer by etching to form an improved silicon nitride film having a capacitance and dielectric strength suitable for use as an insulating film in a semiconductor memory device, and then forming a conductive layer on the silicon nitride film.

2. The process of claim 1 in which the silicon nitride film is formed at a temperature of 600° to 800° C. by using ammonia or nitrogen as a nitrogen source and silane or derivative thereof as a silicon source.

3. The process of claim 1 in which the silicon nitride film has a $SiO_2$ equivalent film thickness of 50 to 100 Å.

4. The process of claim 1 in which the silicon oxide layer is formed by a thermal oxidation.

5. The process of claim 1 in which the silicon oxide layer has a thickness of 10 to 20 Å.

6. The process of claim 1 in which the silicon oxide layer is removed by wet-etching or dry-etching.

7. The process of claim 6 in which the wet-etching is conducted by using an etchant containing hydrogen fluoride.

8. The process of claim 1 in which the substrate comprises a silicon wafer or a silicon wafer laminated with a polycrystalline silicon layer.

9. The process of claim 8 in which the substrate further includes an oxide layer thereover.

10. The process of claim 9 in which the oxide layer comprises a layer of $SiO_2$ or $Ta_2O_5$.

* * * * *